United States Patent [19]

Siebert

[11] Patent Number: 5,507,870
[45] Date of Patent: Apr. 16, 1996

[54] OPTICAL COATINGS HAVING A PLURALITY OF PRESCRIBED PROPERTIES AND METHODS OF FABRICATING SAME

[75] Inventor: Edward T. Siebert, New Fairfield, Conn.

[73] Assignee: Hughes Aircraft Company, Los Angeles, Calif.

[21] Appl. No.: 361,008

[22] Filed: Dec. 21, 1994

Related U.S. Application Data

[63] Continuation of Ser. No. 804,866, Dec. 6, 1991.

[51] Int. Cl.$^6$ ................................................. C23C 14/00
[52] U.S. Cl. ........................... 118/664; 118/712; 118/715
[58] Field of Search ................... 118/663, 664, 118/707, 712, 715; 427/10, 255.2, 248.1

[56] References Cited

U.S. PATENT DOCUMENTS

| | | | |
|---|---|---|---|
| 4,837,044 | 6/1989 | Murarka | 427/10 |
| 5,154,810 | 10/1992 | Kamerling | 204/192.13 |

FOREIGN PATENT DOCUMENTS

| | | |
|---|---|---|
| 497499 | 8/1992 | European Pat. Off. . |
| 63-273205 | 10/1988 | Japan . |

OTHER PUBLICATIONS

Martin, Appl. Phys. Lett. 58(22) Jun. 3, 1991, pp. 2497–2499.
Ennos, Stresses Developed in Optical Film Coatings, Applied Optics, vol. 5, No. 1, Jan. 1966.

Primary Examiner—Richard Bueker
Attorney, Agent, or Firm—W. C. Schubert; W. K. Denson-Low

[57] ABSTRACT

A method is disclosed for specifying the ratios of three or more coating materials so as to specify and control the index of refraction profile, stress profile, and/or the coefficient of thermal expansion of an optical coating. Also disclosed is a coating deposition chamber (10) that includes an in-situ stress monitor (12) for measuring a stress within a coating (20). The output of the monitor is compared to predicted profiles and appropriate corrections are made to chamber constants. In a presently preferred embodiment, the in-situ stress monitor includes an interferometer having a sample beam (28a) that reflects from a surface of a substrate (22) upon which the coating is being formed. A change in the optical path length is indicative of a direction and magnitude of a substrate flexure due to stress induced in the coating. Responsive to the determined stress, coating chamber operating parameters are varied, if required, to maintain the stress at a desired magnitude and type.

6 Claims, 4 Drawing Sheets

OPTICAL COATINGS HAVING A PLURALITY OF PRESCRIBED PROPERTIES AND METHODS OF FABRICATING SAME

This is a continuation application Ser. No. 07/804,866 filed Dec. 6, 1991.

FIELD OF THE INVENTION

This patent application relates generally to coatings for optical devices and, in particular, relates to coating deposition methods, specification, and apparatus.

BACKGROUND OF THE INVENTION

Conventional optical coatings are designed primarily for optical performance. Thus, stress within the coatings is not controlled, or only crudely controlled, so that the coating does not flake off of the substrate to which it is applied. As a result, coatings that must be hardened for operation in adverse environments, such as for high power laser, x-ray, nuclear, high temperature or cryogenic, or high thermal flux applications; or those coatings required to be made very thick, such as rugate coatings, are prone to stress failures. To overcome this limitation, while producing coatings with suitable optical properties, a technique is required wherein both the stress and the coefficient of thermal expansion (CTE) of the coating is either made small or is controlled.

Reference is made to an article entitled "Stresses Developed in Optical Film Coatings", Applied Optics, Vol. 5, No. 1, January 1966, by Anthony E. Ennos. This article describes the use a thin silica strip as one mirror of a laser interferometer that is mounted within a coating chamber. As the coating is deposited upon the strip a bending of the strip occurs. The bending is measured by the interferometer and is correlated with stress in the coating.

Most conventional optical coatings are fabricated by employing a sequential and/or co-evaporation of two materials. The material and coating design are determined by the optical performance. Stress is considered only though the selection of material pairs that produce durable coatings. It has also been known that gradient index of refraction coatings and rugate coatings may be fabricated by the co-evaporation of two optical materials. For a gradient index coating the mixture of materials is chosen so as to control the index of refraction as a function of coating thickness. However, little or no consideration has been directed to the problem of stress buildup within conventional coatings.

As an example, FIG. 1 illustrates in graphical form the stress buildup within a multilayer coating due to layer stress mismatch. Ideally, the stress within the individual coating layers is alternately tensile and compressive. However, stress balance is never perfect and, thus, residual stress builds up within the coating as the thickness is increased.

As a result, at some thickness ($T_F$), a stress-induced failure of the coating occurs. This stress induced failure adversely affects the optical properties and/or the physical properties of the coating.

Also by example, reference is made to FIG. 6 which shows the effect of a deposition of a $ThF_4$ coating upon a Cer-Vit substrate (curve A) and the effect of the deposition of the $ThF_4$ coating upon a KCl substrate (curve B). As can be seen, during deposition (region C) the film tensile stress for both substrate systems increases and then levels off, although each attains a different final tensile strength value. However, during cooling (region D) the film stress for the $ThF_4$/Cer-Vit system continues to increase in tensile stress whereas the $ThF_4$/KCl material system develops a compressive film stress. These changes in the stress during cooling result from the differential contraction between the coating and the substrate, in that the coating and substrate have different CTEs (Coefficients of Thermal Expansion). As can be appreciated, the resulting induced stress within each of these systems may prove detrimental during use of the deposited coatings, especially if such use tends to further increase the tensile stress for the $ThF_4$/Cer-Vit material system or to further increase the compressive stress for the $ThF_4$/KCl material system.

It is thus one object of the invention to provide coatings for optical devices wherein the stress and/or CTE of a coating is specified and controlled.

It is a further object of the invention to provide method and apparatus for fabricating a coating upon a substrate such that the optical properties and the stress and/or CTE properties of the coating are simultaneously controlled by the co-evaporation or sequential evaporation of a plurality of coating materials.

It is a still further object of the invention to provide method and apparatus for fabricating thick coatings, such as rugate coatings, that exhibit a higher optical density and/or a narrower bandwidth than attainable with conventional coating methodology, while controlling the stress and/or CTE characteristics of the coating to be within prescribed values.

SUMMARY OF THE INVENTION

The foregoing and other problems are overcome and the objects of the invention are realized by method and apparatus for producing optical coatings for, by example, pulsed laser, x-ray, and nuclear hardened applications by a process that pre-stresses the coating and/or provides a lower CTE/greater strength in outer coating layers or other regions of high radiation absorption. The invention also provides method and apparatus for fabricating superior optical coatings for cw laser/x-ray applications, as well as coatings capable of surviving high thermal fluxes or large temperature extremes, by tailoring the coating CTE to match that of the underlying substrate.

In accordance with a method of the invention, a coating is specified so as to obtain a desired index of refraction profile as a function of thickness. Next, a desired stress and/or CTE profile is chosen. This may be, by example, a zero stress, a CTE matched to the substrate material, or a specific stress profile that is required for an intended application. Based upon the desired index of refraction and the stress and/or CTE profiles as a function of thickness, a system of simultaneous equations is solved to obtain a required mixture ratio for selected coating materials. It should be understood that the terms source materials and coating materials are used interchangeably herein and denote coating materials which are amenable to being deposited onto a substrate using conventional means. In this regard, deposited is used in its conventional connotation. Accordingly, deposition of coating or source materials is to be understood in its conventional meaning and would not include reaction of gaseous materials with a deposited coating since reaction is not deposition and gases are not coating (source) "materials" as these terms are used herein.

It is shown that by specifying the ratios of three coating materials that control is achieved over the coating index of refraction and either the stress or the CTE. It is also shown that by specifying the ratios of four coating materials that control is achieved over the coating index of refraction and the stress and CTE.

Further in accordance with the invention a coating deposition chamber includes an in-situ stress monitor to measure coating stress or CTE. The output of this monitor is compared to predicted profiles and appropriate corrections are made to the chamber constants. In a presently preferred embodiment, the in-situ stress monitor includes an interferometer having a sample beam that reflects from a surface of the substrate upon which the coating is being formed. A change in optical path length of the sample beam is indicative of a direction and magnitude of a substrate flexure due to stress induced in the coating.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
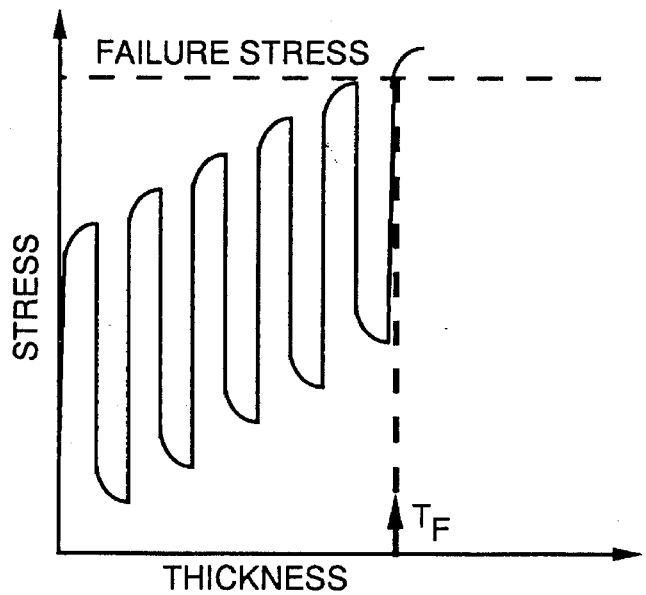
FIG. 1 is a graph depicting a stress buildup in a multi-layered optical coating of the prior art.

As employed herein the term "optical coating" is intended to encompass coatings that are used with radiation within the visible spectrum of wavelengths, and also coatings that are used with radiation within other wavelength bands, such as the ultraviolet (UV) and infrared (IR) spectrums. The term "optical coating" is also intended to encompass any coatings that are fabricated by optical coating techniques.

The following Table illustrates an underlying principle of the invention and shows, for several different coating complexities, an effect upon coating properties.

TABLE 1

| COATING COMPLEXITY | DEGREE OF CONTROL OF COATING PROPERTIES |
| --- | --- |
| One material | Index of refraction, stress, CTE, are all predetermined (prior art) |
| Two materials | Control index of refraction OR stress OR CTE (prior art) |
| Three materials | Control index of refraction AND stress OR CTE |
| Four materials | Control index of refraction AND stress AND CTE |

It is seen that as additional coating materials are used, that additional coating properties can be specified and controlled. In that techniques for the controlled co-evaporation of two materials are presently known, the invention extends the conventional methodology in novel ways to provide a co-evaporation of three or more materials so as to simultaneously prescribe and control a plurality of coating properties.

An important aspect of the invention is an ability to solve a set of simultaneous equations for index of refraction and stress, as a function of coating material mixture ratios, so as to specify a coating in which both the index of refraction and stress and/or CTE characteristics are specified. As an example, a discussion is now made for a three material system in which the index of refraction and stress are to be controlled. The linearized equations for index of refraction and stress are:

$$\text{index of refraction} = N = N_1 X + N_2 Y + N_3 (1-X-Y) \tag{1}$$

and $$\text{stress} = S = S_1 X + S_2 Y + S_3 (1-X-Y) + [C_1 X + C_2 Y + C_3 (1-X-Y)](T-TO) + SO \tag{2}$$

where X and Y represent the fractions of materials 1 and 2 in the mixture, and where (1-X-Y) is a fraction of material 3. X and Y are the quantities to be solved for. $N_i$ is the index of refraction of the ith material, $S_i$ is an internal stress of the ith material, and $C_i$ is a temperature dependent stress of the ith material, which is proportional to the CTE difference between that material and the substrate. These are all known and/or measured quantities of the coating materials and substrates. The temperature dependent stresses (C) are multiplied by the temperature difference between the coating temperature T and the operating temperature $T_O$ at which the desired stress is to be achieved. S0 represents known intrinsic stresses, such as known measured surface effects. These include, but are not limited to, stress induced by lattice dislocations at interfaces and by absorption/chemical reactions with air.

After the temperatures are specified, Eq. (2) becomes:

$$\text{stress} = S = S'_1 X + S'_2 Y + S'_3 (1-X-Y) + S0 \tag{3}$$

where $S'_i = S_i + C_i(T-T0)$ which is a total stress coefficient (internal stress plus CTE).

Equations 1 and 3 represent two equations for N and S that are a function of two unknowns (the mixture fractions X and Y). These equations are then solved for X and Y, from which the ratio of material 3 is determined.

Figure 3:
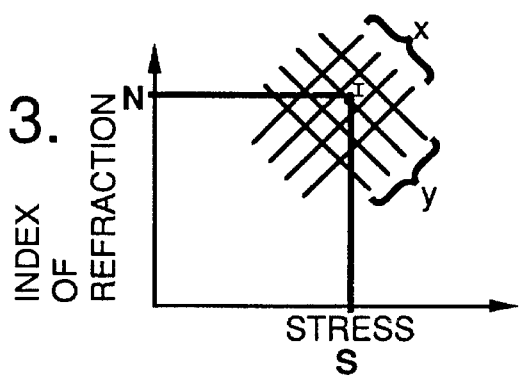
FIG. 3 is a graph that depicts one method of selecting a ratio of two coating material compositions as a function of a desired index of refraction and a desired stress.

FIG. 3 shows a graphical solution for selecting the material compositions of X and Y for a given index of refraction and a given stress. It should be noted that the assumed linearity of the equations is not essential and that the equations could also be non-linear. For either case, however, a solution exists. For non-linear equations, the curves in FIG. 3 have different shapes (not straight and not evenly spaced), but, in general, the same graphical technique may be employed to determine a solution. The graph of FIG. 3 is entered at the desired index of refraction N and stress S. The intersection, designated (I), gives the required values of X and Y.

For determining the values of X and Y at a number of points through the thickness of the coating, the graph is entered a plurality of times with the specified values for the index and the stress at each specified point within the thickness. Based on the foregoing description, it is now shown that it is further within the scope of the invention to also control the CTE (temperature dependent stresses) of a coating, rather than the internal stress, by letting:

$$C=(E_c/(1-\mu_c))(\alpha_c-\alpha_s)= C_1+C_2Y+C_3(1-X-Y) \quad (4)$$

where $E_c$, $\mu_c$, $\alpha_c$ are the Young's modulus, Poisson's ratio, and CTE, respectively, of the coating, and $\alpha_s$ is the CTE of the substrate. This assumes negligible stress relief in the coating due to substrate deformation. Note that C also depends on the substrate parameter $\alpha_s$ so that:

$$C_i=\alpha_iE_i/(1-\mu_i)-\alpha_sE_i/(1-\mu_i)=A_i-\alpha_sB_i \quad (5)$$

This explicitly shows the dependence of C on $\alpha_s$. $A_i$ and $B_i$ are defined by equation 5 and depend only on the material properties of the coating. It should be noted that all material properties, N, S, and C, also have implicit dependence on coating chamber parameters. Thus:

$$CTE_c=(C(1-\mu_c))/E_c+CTE_s;$$

$$C=C_1X+C_2Y+C_3(1-X-Y) \quad (6)$$

A graph similar to that depicted in FIG. 3 may be constructed to plot index of refraction versus CTE as a function of X and Y.

Furthermore, it is within the scope of the invention to simultaneously control the index of refraction, internal stress, and CTE by adding a fourth material and another equation for the temperature dependent stress (C). This results in three equations (for N, S and C), in three unknowns (mixture fractions X, Y, and Z), which are solved by the same methodology. That is:

$$N=N_1X+N_2Y+N_3Z+N_4 (1-X-Y-Z)$$

$$S=S_1X+S_2Y+S_3Z+N_4 (1-X-Y-Z)+S_o+C\Delta T, \text{ and}$$

$$C=C_1X+C_2Y+C_3Z+C_4 (1-X-Y-Z) \quad (7)$$

An extension of the graph in FIG. 3 provides a three dimensional graph structure for representing the index of refraction, the stress, and the CTE, each on a different axis, with their intersection giving X, Y, and Z, Based on the equations (7), it is also within the scope of the invention, and knowing the mixture fractions X, Y, and Z, to solve for $N_i$, $S_i$, and $C_i$.

Figure 4:
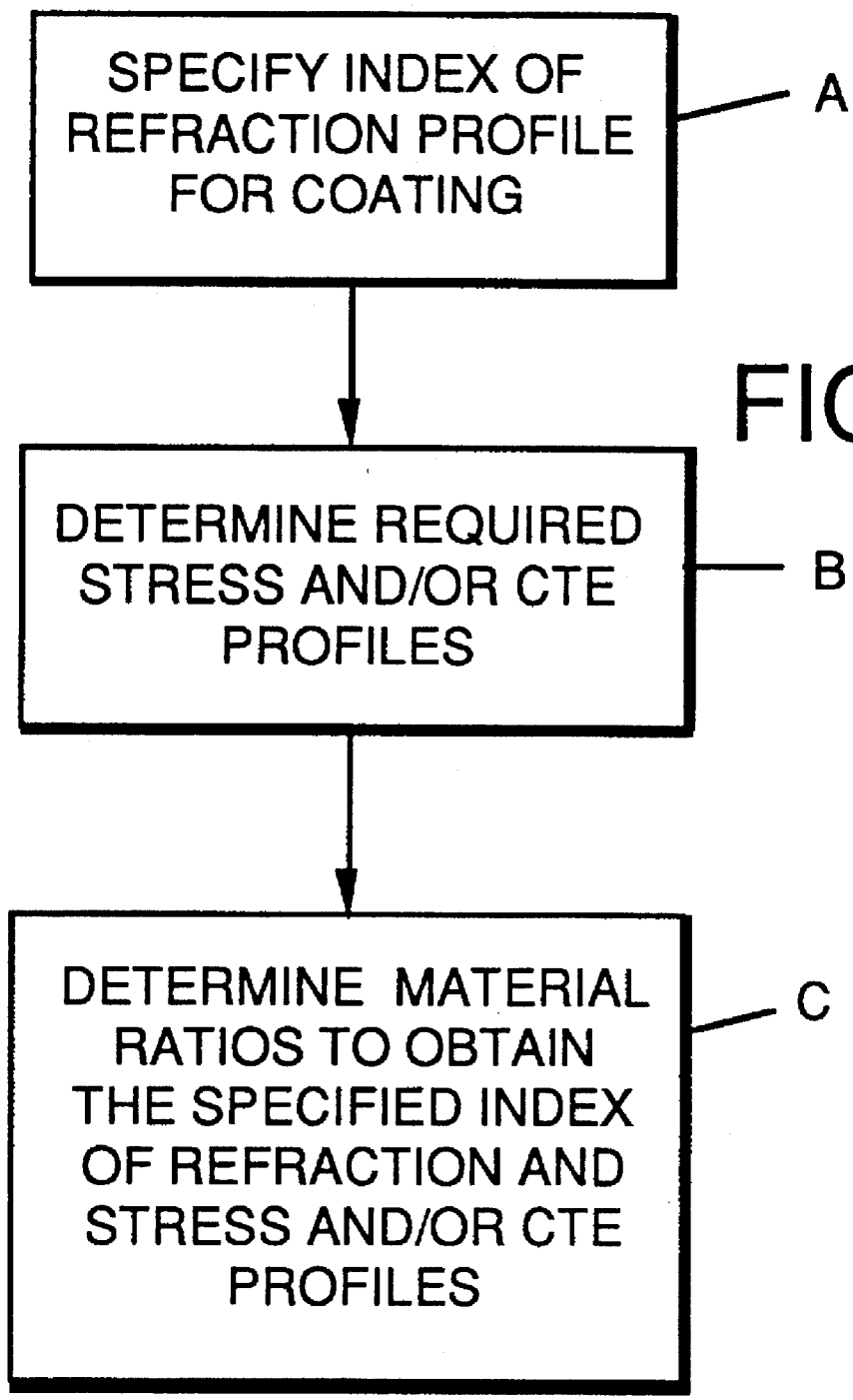
FIG. 4 is a flowchart that illustrates a method of the invention.

One suitable coating design approach is illustrated in FIG. 4. First, at Block A, the coating is specified in a conventional fashion so as to obtain a desired index of refraction profile as a function of thickness. This may be accomplished with known types of coating design programs. Second, at Block B, the desired stress and/or CTE profile is chosen. This may be, by example, zero stress, a CTE matched to the substrate material, or a specific stress profile that is required for an intended application. Knowing the desired index of refraction and stress/CTE profiles, as a function of thickness, the solution set of the simultaneous equations (FIG. 3) is entered to obtain the desired mixture ratios as a function of thickness (Block C). The coating design is then complete.

It is noted that a profile does not necessarily require that a coating parameter be varied through the thickness of the coating. By example, if a constant index of refraction is desired, the resulting "profile" has the index value constant throughout the coating thickness.

Figure 2:
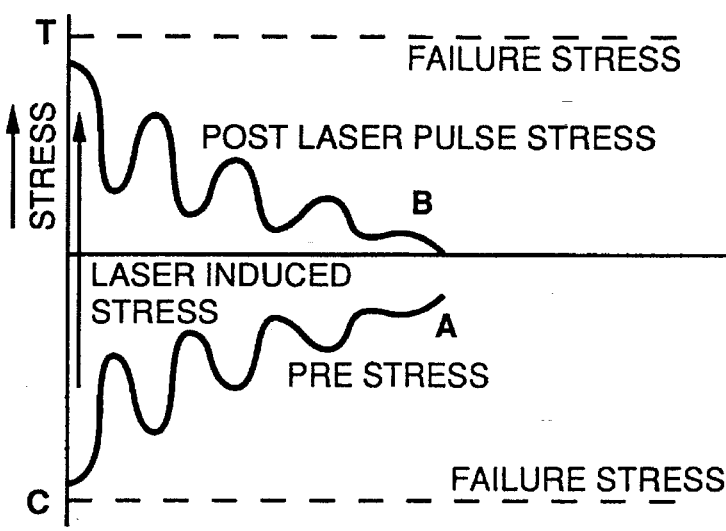
FIG. 2 is a graph that depicts a stress profile of a prestressed optical coating.

Reference is made to FIG. 2 as an example of specifying a pulsed laser/x-ray hardened coating. Two failure stresses are indicated, one for compressive stress (C) and one for tensile stress (T). Using a coating design and materials, for which a zero CTE cannot be obtained, the assumed and/or measured thermal and absorption properties of the materials are considered. Then, through the use of known types of thermal modelling programs, a thermal distribution within the coating is obtained. From the predicted thermal distribution the stress distribution or profile within the coating is obtained. Using this stress profile and the known/assumed tensile and compressive failure stresses of the materials, a coating design is arrived at wherein the coating is fabricated so as to be prestressed (curve A) to obtain improved survivability by maintaining the post-laser pulse stress curve within acceptable stress limits (curve B).

The above approach is particularly useful for gradient index of refraction coatings where the index of refraction and stress are controlled throughout the coating. However, this approach can be applied equally well to discrete coatings on an equivalent layer basis.

It is noted that in discrete layered coatings there can be residual stress in each layer due to lattice mismatches, but that the stress in each period is controlled. An advantage of gradient coatings is that the stress at each point in the coating is controlled. Thus, the stress in a zero-stress gradient coating is zero everywhere, while in a discrete coating the stresses are zero only on an equivalent layer or period basis. However, this is still useful, in that it prevents stress buildup within thick, discrete layered coatings.

Figure 5:
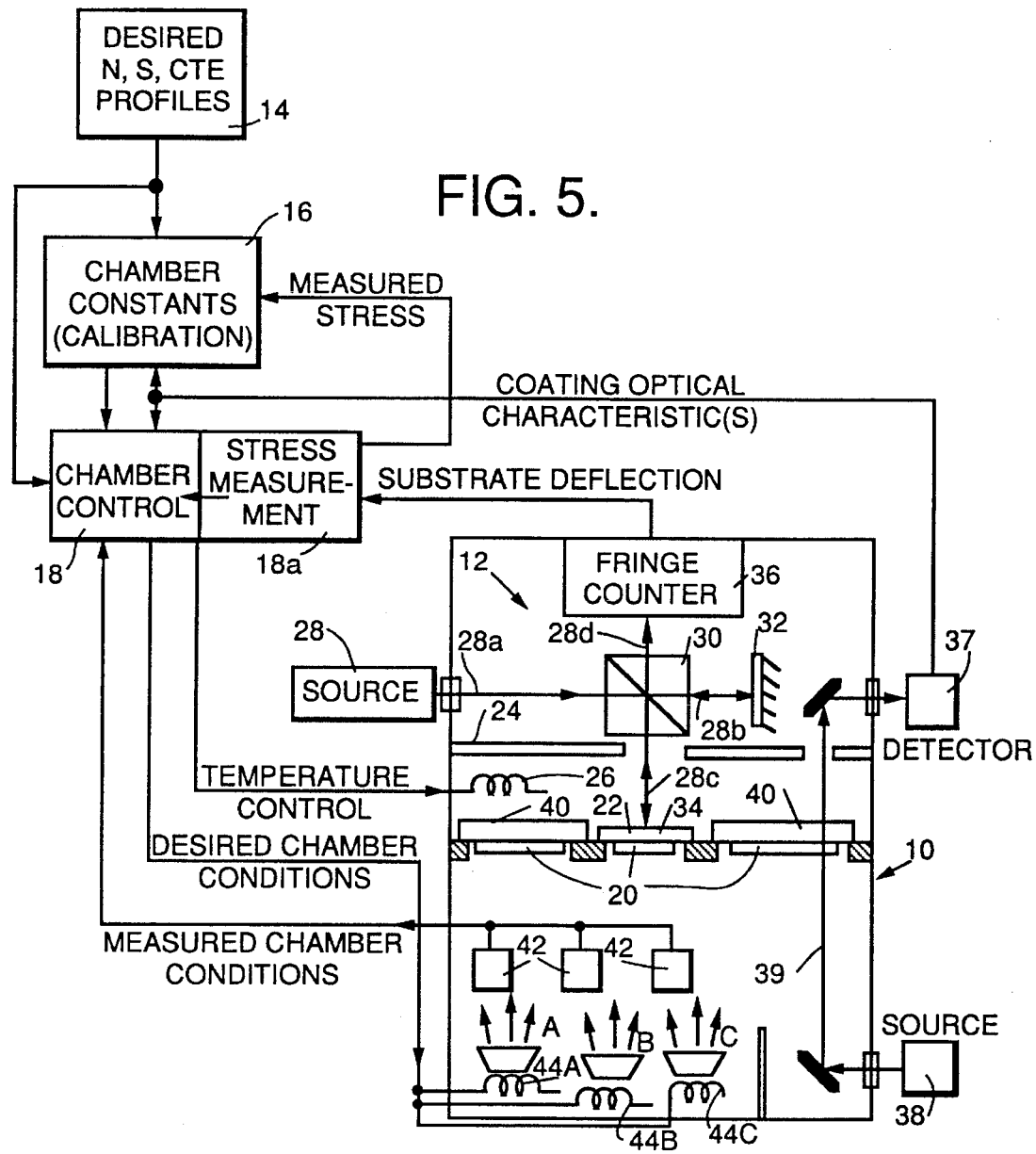
FIG. 5 is a block diagram of a coating deposition system that is constructed and operated in accordance with the invention.

FIG. 5 illustrates an embodiment of a coating fabrication apparatus that operates in accordance with a further aspect of the invention. That is, the coating fabrication includes an in-situ stress measurement system for monitoring and controlling the stress within a coating during the time that the coating is deposited upon a substrate. The same stress measurement system may also be employed to monitor the stress within the coating after the coating fabrication is ended.

FIG. 5 shows a coating chamber 10 that includes an in-situ stress monitor 12. A block 14 illustrates the entry of the desired index of refraction and stress profiles as determined in accordance with the foregoing description and in accordance with FIG. 3. A block 16 includes coating chamber calibration constants. The desired index of refraction and stress profile, in conjunction with the chamber calibration constants, provide a coating mixture profile (X, Y, . . . ) as well as coating temperature, partial pressures, etc., which are provided to a closed loop chamber controller 18. The closed loop chamber controller 18 operates to produce the specified coating. This is accomplished by providing within the chamber 10 a plurality of sources of coating material (designated A, B, C). The chamber 10 is evacuated or maintained at some predetermined gas pressure and the coating materials are evaporated in a known fashion so as to produce a coating 20 on a surface of any number of substrates 40 to be coated, plus a stress monitoring substrate 22. The chamber 10 includes means, shown as an enclosure 24 having a heater 26, for maintaining the substrates 40 and 22 at a specified temperature during the deposition process.

However, due to the occurrence of variable conditions during each coating run, the chamber constants 16 may drift with time. To overcome this problem the in-situ stress monitor 12 and an optical monitor 37 are employed to measure the coating stress and coating optical properties, respectively. The output of these monitors are compared to predicted profiles and appropriate corrections are made to the chamber constants.

For measuring material parameters, the stress control loop is opened and the chamber controller considers chamber parameters such as rates, mixtures, temperature, gas pressures, etc., to determine the material constants N, S, and C.

The in-situ stress monitor 12, for this embodiment of the invention, is optically coupled to the substrate 22 and includes an optical source 28 that provides coherent or semi-coherent radiation 28a. A beamsplitter 30 splits the source radiation 28a into a reference beam 28b and a sample beam 28c. The reference beam 28b is directed to and reflected from a reference mirror 32. The sample beam 28c is directed to and reflected from a reflective region 34 provided on a back surface (preferably a non-deposition surface) of the substrate 22. The beamsplitter 30 combines the reflected reference beam 28b and the reflected sample beam 28c and provides a combined beam 28d to a fringe counter 36. The fringe counter 36 operates interferometrically to compare the resulting interference fringes so as to determine a relative displacement of the reflecting region 34 relative to the reference mirror 32. A change in this displacement is indicative of a change in the sample beam 28c optical path length, which in turn is due to a stress-induced displacement of the substrate 22 surface. The output of the fringe counter 36 is thus expressive of the magnitude of the stress within the deposited coating 20, this stress deforming the substrate 22 and thereby lengthening or shortening the optical path length of the sample beam 28c.

Figure 6:
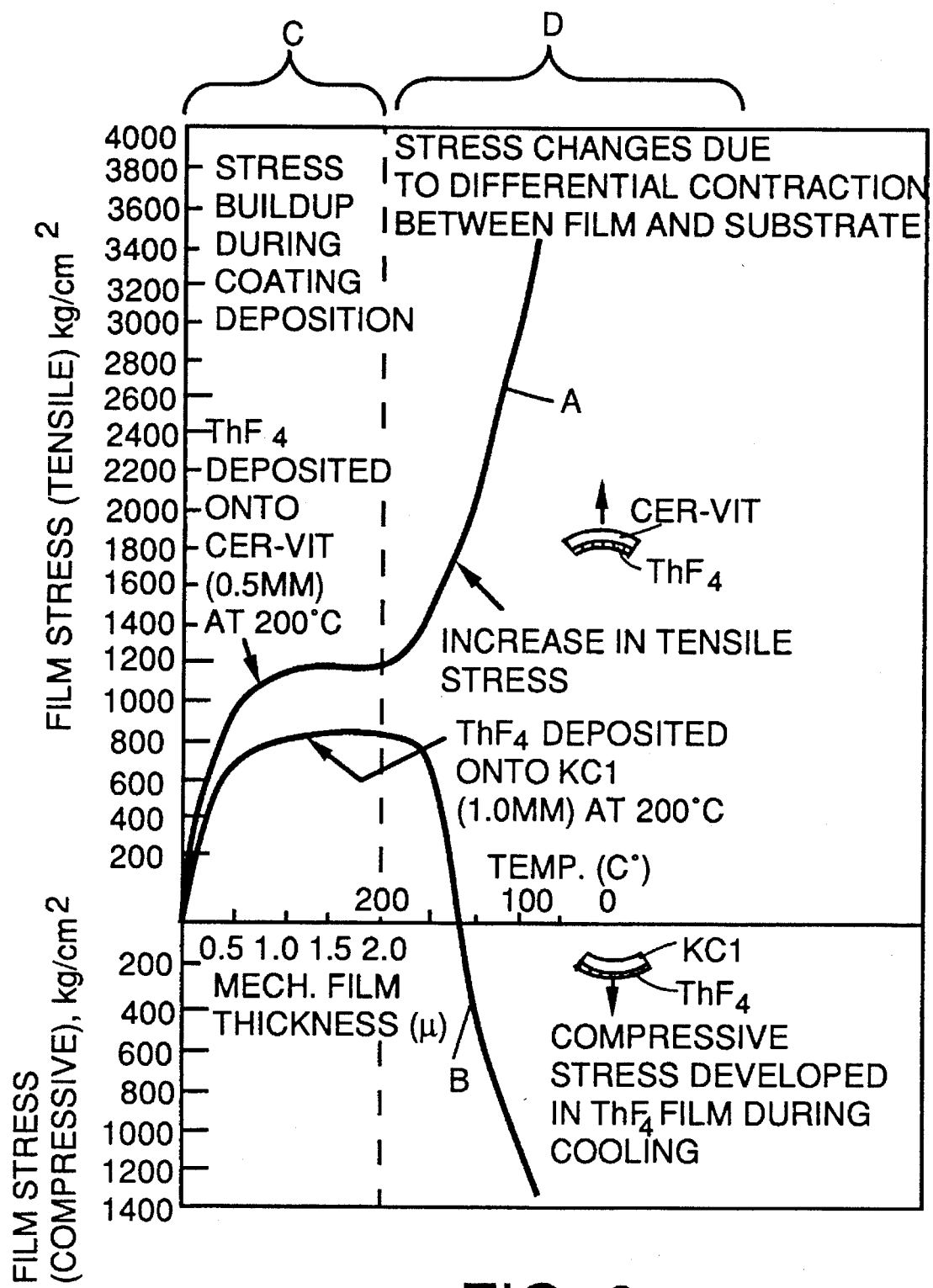
FIG. 6 illustrates an effect of the same coating material upon two different substrate materials having differing coefficients of thermal expansion.

As an example, for the $ThF_4$/Cer-Vit system of FIG. 6 the optical path length of the sample beam 28c would be shortened during deposition, and then further shortened during cooling. For the $ThF_4$/KCl system of FIG. 6, the optical path length of the sample beam 28c would be shortened during deposition, and then lengthened during cooling.

In either case, the measured deflection of the substrate 22, in conjunction with the known substrate 22 material properties and dimensions, enables the chamber controller 18 to determine the coating stress. It will be appreciated that the thinner the substrate 22, the greater its sensitivity to stress. Therefore, for high sensitivity to stress, the stress monitor substrate 22 is generally much thinner than the other substrates to be coated. Preferably, all substrates should be of the same material, but different substrate materials can be used with proper corrections for differing material coefficients; such as compensating for differences in $S_o$ and C.

The chamber 10 also includes the separate optical monitor for monitoring the transmission of radiation through the forming substrate/coating system. This is preferably provided by a radiation source 38 disposed to provide a beam 39 that passes through the coating/substrate 40 and an optical monitor or detector 37 for receiving the beam. This enables the index of refraction and/or the thickness of the coating to be monitored by the chamber controller 18 during the deposition of the coating.

In FIG. 5 three source materials (A, B, C) are shown. It should be realized that the number of source materials that are co-evaporated is a function of the desired index of refraction or index of refraction profile, and the number of coating characteristics that are to be controlled. By example, for a two source system one of the source materials may be $ThF_4$, having an index of refraction of approximately 1.5 for visible wavelengths, while another coating material may be ZnSe, having an index of refraction of approximately 2.4 for visible wavelengths. The co-evaporation of these two materials results in the deposition on the substrate 22 of an amorphous mixture comprised of $(ThF_4)_x(ZnSe)_{1-x}$. The resulting index of refraction varies, as a function of coating thickness, between approximately 1.5 and 2.4.

As an example of a three source material system, one source material may be $SiO_2$, a second source material may be $TiO_2$, and a third source material may be $HfO_2$. The resulting coating is comprised of $(SiO_2)_x(TiO_2)_y(HfO_2)_{1-x-y}$, wherein x and y are controlled so as to provide a desired index of refraction and also a desired stress or CTE coating characteristic. If four coating materials are provided a desired index of refraction and also a desired stress and a CTE coating characteristic may be obtained.

For all of these various two, three, or four source material combinations the in-situ stress monitor 12 enables the stress characteristic to be monitored during deposition such that real-time corrections can be made to the chamber 10 parameters to maintain the coating stress within predetermined limits. If the stress, or the index of refraction as measured by the optical monitor (37,38), is found to differ from the desired value, then the equations (7) can again be employed so as to compensate for the deviation. In one example, employing measured values of N, S, and C, and the inputted values of X, Y, and Z, the equations (7) are solved for a revised set of material constants for use during the remainder of the coating deposition run.

Further in regard to FIG. 5 the output from the fringe counter 36 is converted by a stress measurement unit 18a into a measurement of stress induced within the substrate 22. As was noted, this stress may be a tensile stress or a compressive stress, with the direction of the substrate 22 deflection indicating one or the other. The magnitude of the deflection is an indication of the magnitude of the induced tensile or compressive stress.

The chamber 10 may also be provided with one or more evaporation rate monitors 42 for measuring the evaporation rate of the source material. Based on the measured evaporation rate the chamber control 18 may vary a resistive heater 44 associated with each of the sources A, B, and C. This is one example of varying a chamber operating parameter. Another example is to vary the partial pressure within the chamber 10 so as to influence the chemical composition of the source material; i.e., oxidize SiO to $SiO_x$. For other chamber embodiments, such as an E-beam deposition chamber, the chamber control 18 may vary the E-beam current.

The output of the stress measurement block 18a, and also the output of the optical monitor 37, may also be provided to the chamber constants block 16 so that the chamber constants can be revised or updated to compensate for changes occurring within the chamber 10.

The in-situ measurement of stress in coatings is desirable for at least the following two reasons. First, in-situ stress measurement enables a determination of coating stress and CTE properties as a function of coating material mixture ratios. Second, in-situ stress measurement enables a real-time correction for coating chamber 10 parameter drifts during a coating deposition cycle.

The first reason given immediately above is important to determine the stress and CTE coefficients of materials and mixtures of materials and is required to design a predetermined stress profile into a coating. The use of the in-situ stress measurement system 12 is especially valuable as a characterization tool whenever new coating materials or new chamber operating conditions are employed. After sufficient material and/or deposition condition characterization, the stress measurement system 12 may not be required for some coating procedures.

The second reason given above is important whenever chamber conditions may vary in an unpredictable manner. The use of the stress measurement system 12 also improves yield by correcting conditions that would otherwise cause coatings to not meet a specification. It is also an effective manner of demonstrating that a stress profile specification has been met (i.e. quality control), as it is generally difficult to assess the stress in a coating already fabricated upon a thick substrate. After sufficient chamber characterization, the stress measurement system 12 may not be required for some procedures.

For at least the above two reasons, the incorporation of the stress measuring system 12 into the coating chamber 10 is an important component of the methodology of designing and fabricating stress controlled coatings.

Although described in the context of an optical stress measurement system 12 that operates in accordance with interferometric principles, it should be realized that other stress monitor embodiments are also within the scope of the teaching of the invention. By example, the substrate may be physically contacted with a small probe, such as an Angstrometer, or be in proximity to a capacitance gauge. Alternately, a strain gauge or a pressure sensitive device, such as a piezoelectric sensor, can be employed to measure the substrate deflection or to measure a force or moment applied to the substrate to prevent same from deflecting, the magnitude of the force or moment being proportional to the stress. Also, the specific materials described herein are not intended to be read in a limiting sense, in that the invention may be practiced with a wide variety of suitable substrate and coating materials, combinations of materials, and deposition methods including, but not limited to, resistance heating, E-beam, sputtering, and ion assist.

Thus, while the invention has been particularly shown and described with respect to a preferred embodiment thereof, it will be understood by those skilled in the art that changes in form and details may be made therein without departing from the scope and spirit of the invention.

What is claimed is:

1. Apparatus for depositing a coating upon a substrate, comprising:

chamber means for containing at least one substrate therein during the deposition of a coating upon a surface of the substrate, said chamber means further including at least three solid source materials and means for depositing said solid source materials on said substrate to form said coating, and wherein said chamber is responsive to a ratio of solid source materials that provides the coating with a desired index of refraction profile and at least one of a desired stress profile and a desired coefficient of thermal expansion profile;

means, for coupling during use to the substrate, for determining a stress associated with the coating being deposited;

means for monitoring an optical characteristic of said coating during said deposition of said coating;

means, coupled to an output of said determining means, for varying at least one chamber means coating deposition parameter in accordance with the determined coating stress; and means, coupled to an output of said monitoring means, for varying at least one chamber means coating deposition parameter in accordance with said monitored optical characteristic.

2. Apparatus as set forth in claim 1 wherein said determining means includes interferometer means for measuring a change in an optical path length of a sample beam that reflects from the substrate, the change in optical path length being a function of a deflection of the substrate.

3. Apparatus as set forth in claim 2 wherein the substrate includes a reflective region disposed upon a surface thereof, the reflective region reflecting the sample beam.

4. Apparatus as set forth in claim 1 wherein said chamber means includes three solid source materials and means for depositing said solid source materials on said substrate, and wherein said chamber means is responsive to a ratio of solid source materials that provides the coating with a desired index of refraction profile and with either a desired stress profile or a desired coefficient of thermal expansion profile.

5. Apparatus as set forth in claim 1 wherein said chamber means includes at least four solid source materials and means for depositing said solid source materials on said substrate, and wherein said chamber means is responsive to a ratio of solid source materials that provides the coating with a desired index of refraction profile, with a desired stress profile, and also with a desired coefficient of thermal expansion profile.

6. The apparatus as set forth in claim 1 wherein each of said at least three solid source materials is a different material.

* * * * *